(12) United States Patent
Moriwaki et al.

(10) Patent No.: US 6,259,593 B1
(45) Date of Patent: Jul. 10, 2001

(54) ELECTRONIC COMPONENT

(75) Inventors: Nobushige Moriwaki; Shigeki Nishiyama, both of Izumo (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/460,049

(22) Filed: Dec. 14, 1999

(30) Foreign Application Priority Data

Dec. 18, 1998 (JP) .................................................. 10-360498
Oct. 5, 1999 (JP) .................................................. 11-283840

(51) Int. Cl.[7] .......................... H01G 4/005; H01G 4/228
(52) U.S. Cl. .................... 361/303; 361/306.1; 361/321.2
(58) Field of Search ............................ 361/306.1, 306.3, 361/307, 368.1, 309, 310, 321.2, 321.3, 321.5

(56) References Cited

U.S. PATENT DOCUMENTS

| 5,410,184 | 4/1995 | Melton et al. ........................ 257/222 |
| 5,489,803 | 2/1996 | Kanbe et al. ........................ 257/767 |

FOREIGN PATENT DOCUMENTS

| 0831683 A1 | 3/1998 | (EP) . |
| 0858859 A1 | 8/1998 | (EP) . |

*Primary Examiner*—Anthony Dinkins
(74) *Attorney, Agent, or Firm*—Ostrolenk, Faber, Gerb & Soffen, LLP

(57) ABSTRACT

A coating layer composed of a solder containing tin as the major component and a metal such as copper or silver which is the same as that contained in a external electrode in an amount greater than the eutectic concentration, is formed on the external electrode. The solder can suppress the solid-phase diffusion without formation of the barrier layer.

19 Claims, 3 Drawing Sheets

- ← H60 EUTECTIC
- ← Sn-3.5Ag
- -●- Sn-5.0Ag
- -●- Sn-6.0Ag
- -●- Sn-10Ag
- -●- Sn-15Ag

ELECTRONIC COMPONENT

BACKGROUND OF THE INVENTION

1. Field of the Invention

The present invention relates to electronic components, and in particular to an improvement in structure in relation to an external electrode formed on an electronic component body.

2. Description of the Related Art

FIG. 1 is a cross-sectional view of a monolithic ceramic capacitor 1 as an exemplary conventional electronic component which is of interest in the present invention.

The monolithic ceramic capacitor 1 is provided with a chip capacitor body 2 as an electronic component body, and thick external electrodes 3 are formed at two opposing ends of the capacitor body 2. In the formation of the external electrodes 3, a paste containing a metal such as copper or silver as a conductive component is applied to predetermined positions of the capacitor body 2 and then is baked. In the interior of the capacitor body 2, a plurality of internal electrodes 4 arc layered and each of the internal electrodes 4 is electrically connected to one of the external electrodes 3.

A barrier layer 5 composed of nickel is formed on each external electrode 3, and then an outer layer 6 composed of tin or solder is formed on the barrier layer 5.

If the barrier layer 5 is not formed, undesirable solid-phase diffusion will occur between the external electrode 3 and the solder used for soldering the monolithic ceramic capacitor 1 onto a circuit board (not shown in the drawing) or between the external electrode 3 and the external layer 6 when the monolithic ceramic capacitor 1 is used at high temperatures. In addition, liquid-phase diffusion also may occur when the solder is in a melted state. The barrier layer 5 prevents the solid-phase diffusion. The outer layer 6 is to improve solderability when the external electrode 3 is soldered to a predetermined conductive land on the circuit board.

In such a monolithic ceramic capacitor 1, however, the formation of the barrier layer 5 will cause other problems in some cases, as described below.

The barrier layer 5 is generally formed by wet plating. Thus, the capacitor body 2 provided with the external electrodes 3 must be dipped into a plating solution for the formation of the barrier layer 5. This will result in reduction of the ceramic component of the capacitor body 2, decrease in strength, deterioration of electrical characteristics or, in the worst case, interlayer separation due to penetration of the plating solution into the internal electrodes 4.

Also, the outer layer 6 is generally formed by wet plating and the plating solution in this case will also result in similar problems. Regarding this, it is known that a plating solution used in plating of tin noticeably results in the above problems.

A means is desired to avoid solid-phase diffusion in the external electrodes 3 without the formation of the barrier layer 5, which requires plating.

SUMMARY OF THE INVENTION

Accordingly, it is an object of the present invention to provide an electronic component satisfying the above requirements.

An electronic component in accordance with the present invention includes an electronic component body and external electrodes formed on the electronic component body. In order to solve the above technical problems, the invention is characterized in that a coating layer including a solder primarily composed of tin and containing the same metal contained in the external electrodes in an amount greater than the eutectic concentration is formed on each of the external electrodes. The solder is preferably lead free.

In the present invention, when the external electrodes contain copper, the solder constituting the coating layer is controlled to contain more than 0.7 percent by weight of copper, which is the eutectic concentration of the copper. More preferably, the solder contains more than about 1 percent by weight of copper. The upper limit of the copper content in the solder is preferably about 5 percent by weight.

In another aspect of the present invention, when the external electrodes contain silver, the solder constituting the coating layer is controlled to contain more than 3.5 percent by weight of silver, which is the eutectic concentration of the silver. More preferably, the solder contains more than about 5 percent by weight of silver. The upper limit of the silver content in the solder is preferably about 15 percent by weight.

In the present invention, the solder preferably contains a trace amount, that is, about 1 percent by weight or less of zinc.

In the present invention, it is preferable that the thickness of the external electrodes be greater than the thickness of the solid-phase diffused layer of the solder formable under temperature conditions to which the electronic component will be subjected, such as temperature conditions applied when the coating layer is formed.

In the present invention, the coating layer is preferably formed by a melted solder dipping process or a solder reflow process.

The present invention is advantageous when the electronic component body comprises ceramic, and is more advantageous when internal electrodes electrically connected to the external electrodes are formed in the interior of the electronic component body, such as a monolithic ceramic capacitor.

The electronic component in accordance with the present invention may further include terminal members coupled with the external electrodes via the coating layers.

DESCRIPTION OF THE PREFERRED EMBODIMENT

Figure 1:
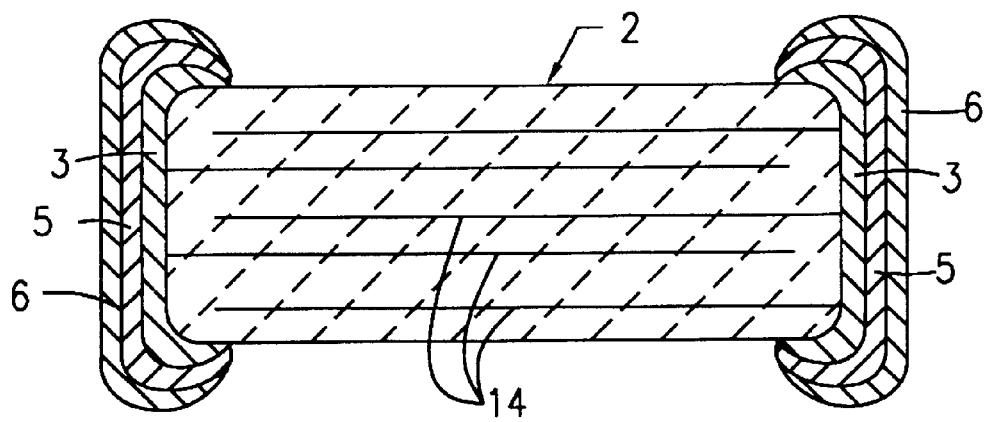
FIG. 1 is a cross-sectional view of a monolithic ceramic capacitor 1 as an example of a conventional electronic component of interest in the present invention.
Figure 2:
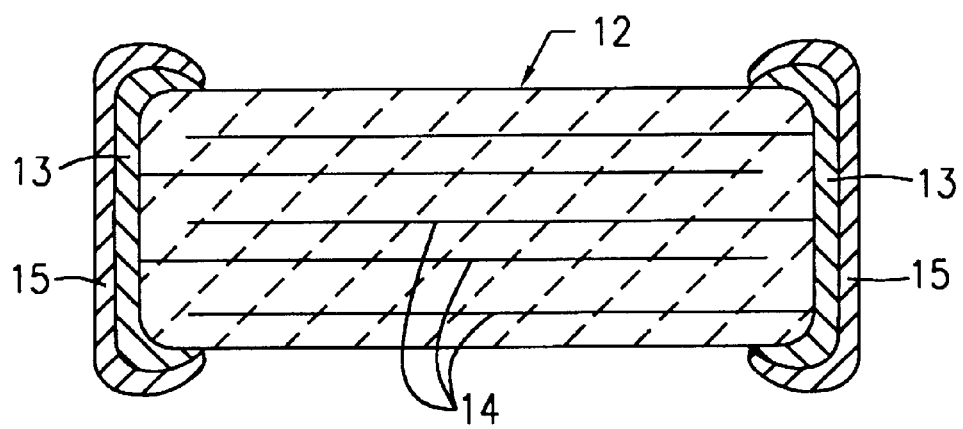
FIG. 2 is a cross-sectional view of a monolithic ceramic capacitor 11 as an electronic component in accordance with an embodiment of the present invention.

FIG. 2 is a cross-sectional view of a monolithic ceramic capacitor 11 as an electronic component in accordance with an embodiment of the present invention. The monolithic ceramic capacitor 11 is provided with a chip capacitor body 12 as an electronic component body, as in the monolithic ceramic capacitor 1 shown in FIG. 1, and external electrodes 13 are formed on two opposing end faces of the capacitor body 12. The external electrodes 13 are composed of thick films which are by applying a paste containing a metal such as copper or silver as a conductive component and then by baking. In the interior of the capacitor body 12, a plurality of internal electrodes 14 are layered and each of the internal electrodes is electrically connected to one of the external electrodes 13.

In this embodiment, coating layers 15 are directly formed on the external electrodes 13. The coating layer 15 comprises a solder primarily composed of tin and containing the same metal contained in the external electrodes 13 in an amount greater than the eutectic concentration. That is, the solder contains copper when the external electrodes 13 contain copper or contains silver when the external electrodes 13 contain silver.

When the solder contains copper, the eutectic concentration of copper is 0.7 percent by weight. Thus, the solder contains copper in an amount greater than the eutectic concentration, and contains an excess amount, for example, 2 percent by weight of copper.

Alternatively, when the solder constituting the coating layer 15 contains silver, the eutectic concentration of silver is 3.5 percent by weight. Thus, the solder contains silver in an amount greater than the eutectic concentration, and contains an excess amount, for example, 6 percent by weight of silver.

It is preferable that the thickness of the external electrodes 13 be greater than the thickness of the solid-phase diffused layer of the solder formable under temperature conditions to which the monolithic ceramic capacitor 11 may be subjected. When the solid-phase diffusion reaches the ceramic portion constituting the capacitor body, oxidation bonds between the external electrodes 13 and the ceramic portion will be cleaved, and thus separation of the external electrodes 13 may occur. An exemplary thickness of the external electrode 13 is approximately 50 μm.

The above-described temperature conditions to which the monolithic ceramic capacitor 11 means the temperature conditions applied when the coating layer 15 is formed, that is, temperature conditions affected by the melted solder, or means temperature conditions applied when the monolithic ceramic capacitor 11 is used.

The coating layer 15 is advantageously formed by a melted solder dipping process or a solder reflow process.

According to the melted solder dipping process, the amount of the solder used for the formation of the coating layer 15 is determined by rheology of the solder. Thus, the coating layer 14 of the solder in a uniform amount can be effectively formed in a short time.

According to the solder reflow process, the capacitor body 12 is moderately heated compared to the melted solder dipping process. Thus, thermal deterioration can be avoided. In the solder reflow process, the amount of the solder imparted is decided by the accuracy of coating of the creamed solder, and coating methods having relatively high accuracy, such as dispensing and dipping, have been established. The resulting coating layer 15 has greater uniformity compared to the melted solder dipping process. Moreover, the solder reflow process enables mass processing in a reflow furnace, and will thus have high productivity.

In general, contact between two metals causes solid-phase diffusion to mutually equalize the concentrations thereof.

Since the activation energy of a substance increases as the temperature increases, the solid-phase diffusion rate increases. In relation to this, the present inventors have discovered a phenomenon in which the solid-phase diffusion rate is decreased when a coating layer 15 composed of a solder containing tin as the major component and the same metal contained in the external electrode 13 in an amount greater than the eutectic concentration of this metal is formed, as described above.

Figure 3:
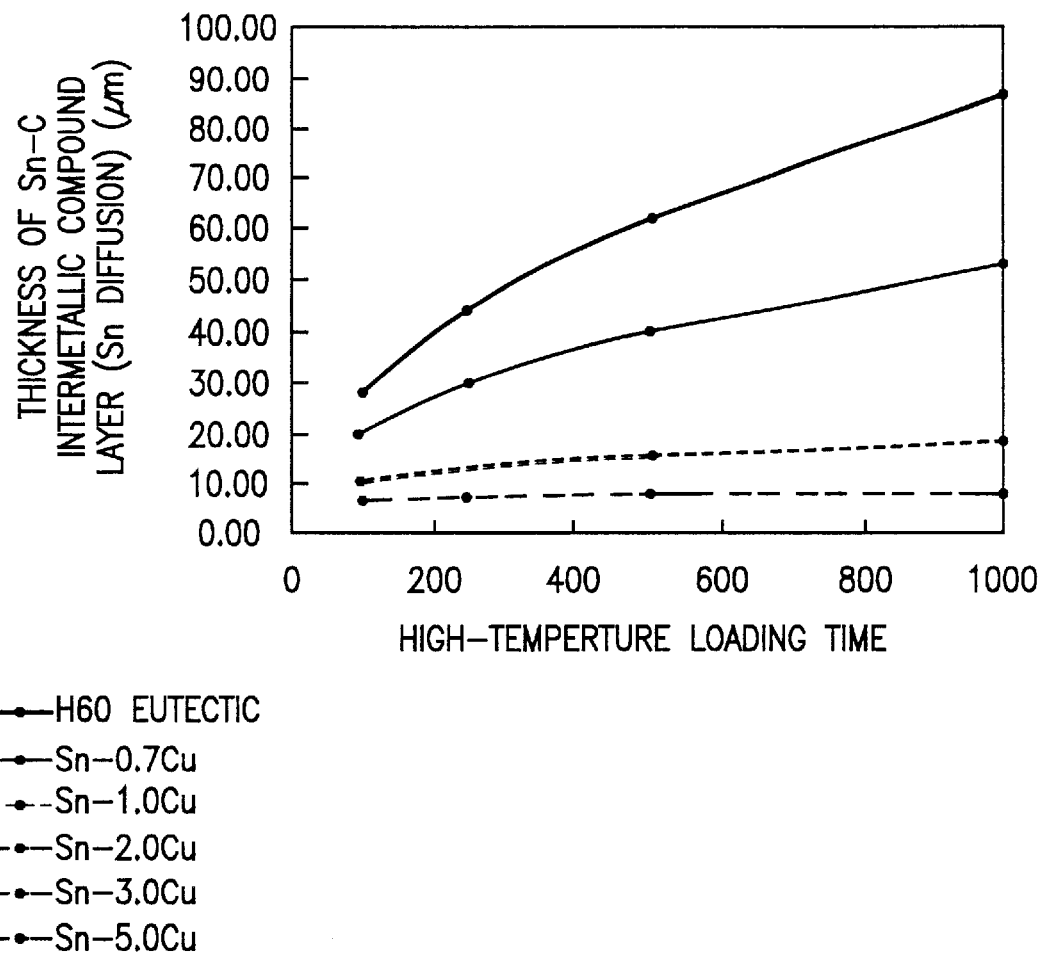
FIG. 3 is a graph of the relationship between the thickness of the Sn—Cu intermetallic compound layer and the high-temperature loading time when coating layers composed of various solders are formed on external electrodes containing copper and subjected to high-temperature loading.

FIG. 3 is a graph showing the relationship between the depth of Sn diffusion into the external electrode, that is, the thickness of the Sn—Cu intermetallic compound layer, and the high-temperature loading time when coating layers composed of various solders are formed on external electrodes containing copper and these are subjected to high-temperature load at 125° C.

With reference to FIG. 3, the eutectic concentration of the copper is 0.7 percent by weight, as described above. When coating layers composed of Sn- 0.7Cu (i.e., 0.7% Cu), Sn-1.0Cu, Sn-2.0Cu, Sn-3.0Cu and Sn-5.0Cu solders are formed, the thickness of the Sn—Cu intermetallic compounds in the external electrodes is less than that of the coating layer formed of an H60 eutectic solder, in spite of long exposure time at high temperature. Thus, the solid-phase diffusion rate is decreased. It is supposed that a difference between the diffusion rates below the eutectic point and above the eutectic point results in such a phenomenon.

As shown in FIG. 3, when the coating layer is formed using a solder containing more than about 1 percent by weight of copper, that is, a Sn-2.0Cu, Sn-3.0Cu and Sn-5.0Cu solder, the thickness of the Sn—Cu intermetallic compound layer in the external electrode can be further decreased.

In addition, the thickness of the Sn—Cu intermetallic compound layer can be maintained constant even when it is allowed to stand for long periods at high temperature. These results are advantageous, since deterioration of properties barely occurs over time when the electronic component is allowed to stand for a considerably long time at high temperature.

When the copper content exceeds about 1 percent by weight in such a case, there is a slight difference between the Sn-2.0Cu solder and the Sn-3.0Cu solder in FIG. 3. Thus, the suppression effect of diffusion does not substantially depend on a change in copper content, and a strict control of the copper content in the solder used is not required.

A copper content exceeding about 5 percent by weight easily causes the formation of dendritic Sn—Cu intermetallic compounds, resulting in embrittlement of the coating layer, although not shown in FIG. 3. Thus, the upper limit of the copper content is preferably about 5 percent by weight.

Figure 4:
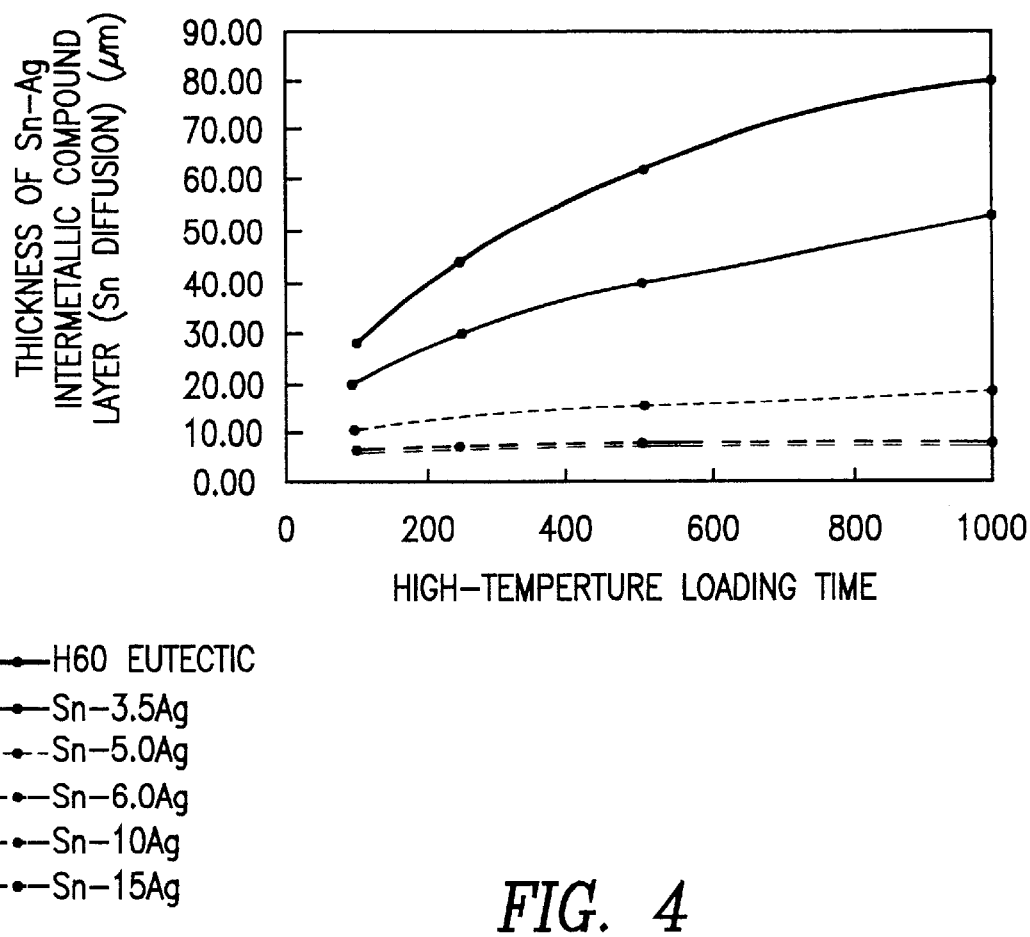
FIG. 4 is a graph of the relationship between the thickness of the Sn—Ag intermetallic compound layer and the high-temperature loading time when coating layers composed of various solders are formed on external electrodes containing silver and are subjected to high-temperature loading.

FIG. 4, corresponding to FIG. 3, is a graph showing the relationship between the depth of Sn diffusion into the external electrode, that is, the thickness of the Sn—Ag intermetallic compound layer, and the high-temperature loading time when coating layers composed of various solders are formed on external electrodes containing silver and these are subjected to high-temperature load at 125° C.

With reference to FIG. 4, the eutectic concentration of silver is 3.5 percent by weight, as described above. When coating layers composed of Sn-3.5Ag, Sn-5.0Ag, Sn-6.0Ag, Sn-10Ag and Sn-15Ag solders are formed, the thickness of the Sn—Ag intermetallic compounds in the external electrodes is less than that of the coating layer formed of a H60 eutectic solder, in spite of long exposure time at high temperature. Thus, the solid-phase diffusion rate is decreased.

It is supposed that a difference between the diffusion rates below the eutectic point and above the eutectic point results in such a phenomenon, as in the above case of copper.

In FIG. 4, when the coating layer is composed of a Sn-6.0Ag, Sn-10Ag or Sn-15Ag solder having a silver content exceeding 5 percent by weight, particularly superior effects for suppression of diffusion are achieved. The thickness of the Sn—Ag intermetallic compound layer in the external electrode is significantly less even when it is allowed to stand to high temperature for a long period, showing a significantly decreased diffusion rate.

In these cases, the thickness of the Sn—Ag intermetallic compound layer in the external electrode is substantially constant independent of the elapsed time, and thus, deterioration of properties over time barely occurs when the electronic component is allowed to stand at high temperatures for long periods.

Also, as shown in FIG. 4, the effects of suppression of diffusion do not substantially change among the Sn-6.0Ag, Sn-10Ag and Sn-15Ag solders; hence, the fluctuation in the silver content does not cause the fluctuation in the effects of suppression of diffusion, and a strict control of the silver content in the solder used is not required.

When the silver content exceeds about 15 percent by weight, the melting point exceeds 300° C. and the working temperature for soldering is increased, although not shown in FIG. 4. Thus, the upper limit of the silver content is preferably about 15 percent by weight.

The solder constituting the coating layer may contain at least one additive in a trace amount, in addition to tin and the same metal as contained in the external electrode. For example, about 1 part by weight or less of zinc is added to the solder to effectively prevent solder erosion. It is not preferred to add bismuth to the solder because the addition of bismuth causes a decrease in soldering strength, although satisfactory solderability is maintained when zinc is added.

According to this embodiment, diffusion of solder to the external electrode 13 can be suppressed, as described above. Thus, this embodiment does not require the barrier layer 5 shown in FIG. 1 for a conventional technique and plating for forming the barrier layer 5. As a result, a high-quality monolithic ceramic capacitor 11 is obtainable without being adversely affected by the plating solution. The coating layer 15 composed of the solder ensures satisfactory solderability.

According to this embodiment, the external electrode 13 is coated with the coating layer 15. Thus, the external electrode 13 is protected from humidity and gases. When a readily oxidizable or corrodible metal, such as copper, is used as a conductive component for the external electrode 13, the oxidation and corrosion of the external electrode 13 can be effectively prevented. Accordingly, the monolithic ceramic capacitor 11 in accordance with this embodiment has high environmental resistivity, and thus has high reliability.

As shown in the following embodiment for an electronic component provided with metal terminal members, it is not always necessary to cover the entire surfaces of the external electrodes with the coating layer, and only some portions of the external electrode may be covered with the coating layer.

Figure 5:
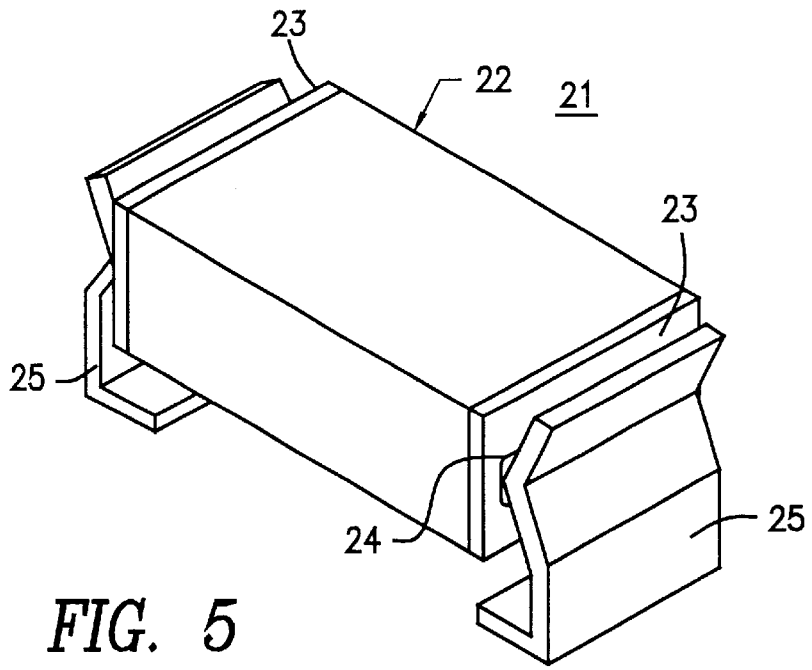
FIG. 5 is an isometric view of a monolithic ceramic capacitor 21 as an electronic component in accordance with another embodiment of the present invention.

FIG. 5 is a perspective view of a monolithic ceramic capacitor 21 as an electronic component in accordance with this embodiment of the present invention.

The monolithic ceramic capacitor 21 has a chip capacitor body 22 as an electronic component body, and external electrodes 23 are formed on two opposing end faces of the capacitor body 22. The external electrodes 23, corresponding to the external electrodes 13 shown in FIG. 2, are formed into a thick film by applying a paste containing a metal such as copper or silver as a conductive component and then by baking.

A coating layer 24 is formed on a part of each external electrode 23, and a terminal member 25 of a metal plate is bonded to the external electrodes 23 via the coating layer 24. The coating layer 24 corresponds to the coating layer 15 shown in FIG. 2 and comprises a solder composed of tin as the major component and the same metal contained in the external electrode 23 in an amount greater than the eutectic concentration.

The coating layer 24 may be formed by, for example, a solder reflow process. That is, a creamed solder is applied at the junction between the external electrode 23 and the terminal member 25, and is heated in a reflow furnace to form a coating layer 24 on a part of the external electrode 23 and to bond the terminal member 25 and the external electrode 23.

As described above, in the monolithic ceramic capacitor 21 having the terminal members 25, the coating layers 24 characterized in the present invention are formed, and the terminal members 25 are bonded to the external electrodes via the coating layers 24. Thus, deterioration of the external electrodes 23 and the capacitor main body 22 is avoided when the monolithic ceramic capacitor 21 is allowed to stand in a mounted state and in an unmounted state. For example, defects, such as detachment of the terminal member 25 from the external electrode 23, are suppressed.

The present invention has been described with reference to the embodiments shown in the drawings, but a variety of modifications are available within the scope of the present invention.

For example, the present invention is also applicable to other ceramic electronic components having electronic component bodies composed of ceramic, and to electronic components other than the ceramic electronic components in addition to the above-described monolithic ceramic capacitors.

The external electrodes formed on the electronic component body function as terminal electrodes in the above-described embodiments. These electrodes also may function as other electrodes, for example, capacitor electrodes or external electrodes such as conductive lands formed on an insulating substrate being the electronic component body.

As described above, the coating layer composed of solder is formed on the external electrode formed on the electronic component body and the solder contains tin as the major component and the same metal as contained in the external electrode in an amount higher than the eutectic concentration. Thus, solid-phase diffusion between the external electrode and the coating layer can be suppressed. As a result, a barrier layer composed of nickel or the like is not necessary, and the electronic component is no adversely affected by a plating solution used in wet plating for forming the barrier layer. Accordingly, a high-quality electronic component is provided with high reliability.

Since the coating layer comprises a solder composed of tin as the major component, it can impart satisfactory solderability to the external electrode.

When the external electrode contains copper in the present invention, the solder of the coating layer is controlled to contain more than 0.7 percent by weight of copper. When about 1 percent by weight or more of copper is contained, suppression of the diffusion is significant, and characteristics can be stabilized when the electronic component is allowed to stand at high temperatures for long periods, due to suppressed deterioration over time. Since the fluctuation in the copper content does not substantially affect the suppression of the diffusion, strict control of the copper content is not necessary.

When the solder of the coating layer contains copper, the formation of dendritic Sn—Cu intermetallic compound is suppressed by controlling the copper content to about 5 percent by weight or less, suppressing embrittlement of the coating layer.

When the external electrode contains silver in the present invention, the solder of the coating layer is controlled to contain more than 3.5 percent by weight of silver. When more than 5 percent by weight of silver is contained, diffusion is significantly suppressed, as in the above copper case, and characteristics can be stabilized. Since the fluctuation in the silver content does not substantially affect the suppression of the diffusion, strict control of the silver content is not necessary.

When the solder of the coating layer contains silver, the formation of the Sn—Ag intermetallic compound is suppressed by controlling the silver content to about 15 percent by weight or less, suppressing embrittlement of the coating layer.

In the present invention, when about 1 percent by weight or less of zinc is added to the solder constituting the coating layer, erosion of the solder is prevented.

In the present invention, when the thickness of the external electrode is greater than the thickness of the solid-phase diffused layer in the solder which is formable under temperature conditions to which the electronic component will be subjected, such as temperature conditions applied when the coating layer is formed, the solid-phase diffusion does not reach the electronic component body. Thus, deterioration of the electronic component body and separation of the external electrodes can be effectively prevented, and thus the advantages of the present invention are not undesirably offset.

When the coating layer is formed by a melted solder dipping process or a solder reflow process in the present invention, the coating layer can be formed uniformly and effectively without using a plating process.

When the electronic component body is composed of ceramic, for example, as in a monolithic ceramic capacitor, and in particular, when internal electrodes electrically connected to external electrodes are formed in the interior of the electronic component body, the advantages in the present invention are noticeable. Penetration of the plating solution during the formation of the conventional barrier layer is a serious problem for electronic component bodies composed of ceramic or having internal electrodes. Reduction by the plating solution is also a serious problem for the electronic component bodies composed of ceramic.

When the electronic component has terminal members bonded to the external electrodes via coating layers in the present invention, the deterioration of the external electrodes is avoided in mounted and in unmounted states of the electronic component. Thus, a disadvantage, that is, undesirable detachment of the terminal members from the external electrodes, is avoidable.

What is claimed is:

1. An electronic component comprising an electronic component body, an external electrode comprising a metal on the electronic component body, and a coating on the external electrode, wherein the coating comprises a tin solder containing the same metal as contained in the external electrode in an amount greater than the eutectic concentration thereof.

2. An electronic component according to claim 1, wherein the external electrodes contain copper and the solder contains in an amount of at least 0.7 percent by weight.

3. An electronic component according to claim 2, wherein the solder contains more than about 1 percent by weight of copper.

4. An electronic component according to claim 3, wherein the solder contains about 5 percent by weight or less of copper.

5. An electronic component according to claim 2, wherein the solder contains about 5 percent by weight or less of copper.

6. An electronic component according to claim 1, wherein the external electrodes contain silver and the solder contains silver in an amount of at least 3.5 percent by weight.

7. An electronic component according to claim 6, wherein the solder contains more than about 5 percent by weight of silver.

8. An electronic component according to claim 7, wherein the solder contains about 15 percent by weight or less of silver.

9. An electronic component according to claim 6, wherein the solder contains about 15 percent by weight or less of silver.

10. An electronic component according to claim 1, wherein the solder contains about 1 percent by weight or less of zinc.

11. An electronic component according to claim 1, wherein the external electrode has a thickness greater than the thickness of a solid-phase layer of the solder diffused therein under the temperature conditions in use for which the electronic component is designed to be subjected.

12. An electronic component according to claim 1, wherein the coating layer is a melted solder dipping layer or a solder reflow layer.

13. An electronic component according to claim 1, wherein the electronic component body comprises ceramic.

14. An electronic component according to claim 13 having at least one internal electrode electrically in the interior of the electronic component body and connected to the external electrode.

15. An electronic component according to claim 14, wherein the electronic component is a monolithic ceramic capacitor.

16. An electronic component according to claim 1, further comprising a terminal coupled to the external electrode via the coating.

17. An electronic component according to claim 1, having a pair of external electrodes on the body, each of which has said coating thereon.

18. An electronic component according to claim 1, wherein the coating covers the entire external electrode surface.

19. An electronic component according to claim 1, wherein the coating covers less than the entire external electrode surface.

* * * * *